(12) United States Patent
Kekkonen et al.

(10) Patent No.: US 10,927,447 B2
(45) Date of Patent: Feb. 23, 2021

(54) LIGHTHOUSE SCANNER WITH A ROTATING MIRROR AND A CIRCULAR RING TARGET

(71) Applicant: Pulsedeon Oy, Tampere (FI)

(72) Inventors: Ville Kekkonen, Jyväskylä (FI); Jarkko Piirto, Oulu (FI); Jari Liimatainen, Oulu (FI); Fergus Clarke, Oulu (FI)

(73) Assignee: Pulsedeon Oy, Tampere (FI)

( * ) Notice: Subject to any disclaimer, the term of this patent is extended or adjusted under 35 U.S.C. 154(b) by 237 days.

(21) Appl. No.: 15/539,221

(22) PCT Filed: Dec. 16, 2015

(86) PCT No.: PCT/FI2015/050893
§ 371 (c)(1),
(2) Date: Jun. 23, 2017

(87) PCT Pub. No.: WO2016/102757
PCT Pub. Date: Jun. 30, 2016

(65) Prior Publication Data
US 2017/0350000 A1    Dec. 7, 2017

(30) Foreign Application Priority Data
Dec. 23, 2014    (FI) ...................................... 20146142

(51) Int. Cl.
*B23K 26/082*    (2014.01)
*G02B 26/12*    (2006.01)
(Continued)

(52) U.S. Cl.
CPC .......... *C23C 14/28* (2013.01); *B23K 26/0624* (2015.10); *B23K 26/0821* (2015.10);
(Continued)

(58) Field of Classification Search
CPC ............ B23K 26/0624; B23K 26/0821; B23K 26/1224; B23K 26/361; B23K 26/36;
(Continued)

(56) References Cited

U.S. PATENT DOCUMENTS 4,387,952 A * 6/1983 Slusher .................. B23K 26/08
219/121.8
4,699,447 A * 10/1987 Howard ............. G06K 7/10693
359/203.1

(Continued)

FOREIGN PATENT DOCUMENTS

CN    1461355 A    12/2003
CN    100999019 A    7/2007
(Continued)

OTHER PUBLICATIONS

European Patent Office, extended Search Report of EP Patent Application No. 15872025.0, dated Sep. 13, 2018, 4 pages.
(Continued)

*Primary Examiner* — Charlee J. C. Bennett
(74) *Attorney, Agent, or Firm* — Berggren LLP (57) ABSTRACT

The present invention introduces a scanning arrangement and a method suitable for coating processes applying laser ablation. The arrangement is suited to prolonged, industrial processes. The arrangement comprises a target, which has an annular form. The laser beam direction is controlled by a rotating mirror locating along the center axis of the annular target. The scanning line will rotate circularly along the inner target surface when the mirror rotates. The focal point of the laser beams may be arranged to locate on the inner target surface to ensure a constant spot size. A ring-formed, a cylinder-shaped or a cut conical-shaped target may be used. The inner surface of the target may thus be tapered in
(Continued)

order to control the release direction of the ablated material towards a substrate to be coated.

11 Claims, 4 Drawing Sheets

(51) Int. Cl.
| | |
|---|---|
| *C23C 14/28* | (2006.01) |
| *C23C 14/54* | (2006.01) |
| *B23K 26/0622* | (2014.01) |
| *G02B 26/10* | (2006.01) |
| *B23K 26/12* | (2014.01) |
| *C23C 14/56* | (2006.01) |
| *B23K 26/361* | (2014.01) |
| *B23K 26/36* | (2014.01) |
| *B23K 103/00* | (2006.01) |
| *B23K 103/02* | (2006.01) |
| *B23K 103/08* | (2006.01) |

(52) U.S. Cl.
CPC .......... *B23K 26/1224* (2015.10); *B23K 26/36* (2013.01); *B23K 26/361* (2015.10); *C23C 14/54* (2013.01); *C23C 14/562* (2013.01); *G02B 26/10* (2013.01); *G02B 26/124* (2013.01); *G02B 26/125* (2013.01); *B23K 2103/02* (2018.08); *B23K 2103/08* (2018.08); *B23K 2103/42* (2018.08); *B23K 2103/50* (2018.08)

(58) Field of Classification Search
CPC ............ B23K 2103/50; B23K 2103/08; B23K 2103/02; C23C 14/28; C23C 14/54; C23C 14/562; G02B 26/10; G02B 26/124; G02B 26/125
USPC ........................................... 156/345.1–345.55
See application file for complete search history.

(56) References Cited

U.S. PATENT DOCUMENTS

| | | | |
|---|---|---|---|
| 4,870,274 A | | 9/1989 | Hebert et al. |
| 5,047,783 A | * | 9/1991 | Hugenin ................. G01S 7/024 250/332 |
| 5,422,753 A | * | 6/1995 | Harris ................... G02B 5/1876 359/216.1 |
| 5,446,755 A | | 8/1995 | Yoshida et al. |
| 5,468,930 A | * | 11/1995 | Nishikawa ............ C23C 14/505 219/121.6 |
| 5,558,788 A | * | 9/1996 | Mashburn .......... B23K 26/0608 219/121.68 |
| 5,760,366 A | * | 6/1998 | Haruta .................. C23C 14/022 219/121.68 |
| 6,033,741 A | | 3/2000 | Haruta et al. |
| 6,045,671 A | | 4/2000 | Wu et al. |
| 6,312,768 B1 | | 11/2001 | Rode et al. |
| 6,356,342 B1 | * | 3/2002 | Hyldahl .................. B41B 19/00 355/77 |
| 6,372,103 B1 | * | 4/2002 | Perry .................. C23C 14/0605 204/192.11 |
| 6,491,749 B1 | * | 12/2002 | Langhals ............. C07D 471/06 106/287.21 |
| 7,528,342 B2 | | 5/2009 | Deshi |
| 8,828,506 B2 | | 9/2014 | Ruuttu et al. |
| 10,283,691 B2 | * | 5/2019 | Darwish ................ H01L 35/22 |
| 2007/0245956 A1 | | 10/2007 | Ruuttu et al. |
| 2008/0043311 A1 | * | 2/2008 | Liu ...................... G02B 27/283 359/226.1 |
| 2008/0116183 A1 | * | 5/2008 | Curry ................... B23K 26/083 219/121.75 |
| 2009/0017318 A1 | * | 1/2009 | Ruuttu .................... C23C 14/20 428/457 |
| 2009/0176033 A1 | * | 7/2009 | Gonzalez Leal ... C23C 14/0623 427/532 |
| 2013/0105298 A1 | * | 5/2013 | Tsunekawa ......... H01J 37/3435 204/192.13 |

FOREIGN PATENT DOCUMENTS

| | | |
|---|---|---|
| EP | 1925964 A1 | 5/2008 |
| JP | S59116373 A | 7/1984 |
| JP | S61-117271 A | 6/1986 |
| JP | H0677157 A | 3/1994 |
| JP | H06-172981 A | 6/1994 |
| JP | 2003-277914 A | 10/2003 |
| JP | 2006-233246 A | 9/2006 |
| JP | 2014-133907 A | 7/2014 |
| JP | 2014-189823 A | 10/2014 |
| WO | 2005028696 A1 | 3/2005 |
| WO | 2013006430 A2 | 1/2013 |
| WO | WO-2013133415 A1 * | 9/2013 ............ B01J 19/12 |

OTHER PUBLICATIONS

European Patent Office, extended Search Report of EP Patent Application No. 15872025.0, dated Sep. 13, 2018, 3 pages.
Finnish Patent and Registration Office, Search Report issued on FI20146142, dated Aug. 21, 2015.

* cited by examiner

LIGHTHOUSE SCANNER WITH A ROTATING MIRROR AND A CIRCULAR RING TARGET

PRIORITY

This application is a U.S. national application of PCT-application PCT/FI2015/050893 filed on Dec. 16, 2015 and claiming priority of Finnish national application FI20146142 filed on Dec. 23, 2014, the contents of all of which are incorporated herein by reference.

FIELD OF THE INVENTION

The invention relates to a laser ablation process used for e.g. coating various materials with a good surface quality. More specifically, the invention relates to a new method for removing the material from the target in order to create particles and/or plasma.

BACKGROUND OF THE INVENTION

Laser ablation is a process for creating a fine particle and plasma stream where laser beams with a very short temporal length but produced with a relatively high frequency are directed towards a target piece of material. After the release of the small fragments and particles of the target material, the released material is in turn directed towards a material desired to be coated, in order to create a coating on top of the desired physical element or surface. The coating may fulfil strict quality requirements if necessary. The process can be varied for different type of applications by changing characteristics of the laser pulses (energy, pulse length, pulse frequency), the target material selection or material structure or by using possibly several separate targets. Further, the process may be varied by varying distances between target, laser source and the coated surface. A yet further possibility is to control and redirect the laser pulses by using e.g. rotating reflective surfaces (like a moving mirror) for laser pulse manipulation. The temperature, pressure and possibly using an additional effective gas in the process chamber give additional control possibilities for the coating creation.

In prior art, reference U.S. Pat. No. 5,760,366 (Harutal) discloses a vast number of different configurations for laser ablation arrangement used for thin film forming. Harutal applies a chamber and the laser beam is directed to the target inside the chamber through a lens and mirror arrangement where the beam travels through a hole in the chamber. Harutal also applies a magnetic field in close vicinity of the target to direct the released plume towards the substrate. FIG. 39 shows an example of two mirrors controlling the laser, with the lens located before the first mirror. Also several separate targets can be used in the same ablation chamber.

A further reference U.S. Pat. No. 6,033,741 (Haruta2) discloses a rather similar arrangement like Harutal, except that the laser beam cross section can be shaped so that the irradiation towards the target surface has a uniform light intensity distribution. In both Harutal and Haruta2, in FIGS. 37-38 there is shown a target scanning arrangement where the laser pulses are fed through a condenser lens. There is a mirror whose relative angle can be changed in relation to the incoming beam and as a result the pulses can be pointed towards an inner circumference of the cylindrical shaped raw material target. It is notable that the effecting angle of the laser pulses with the target is an acute angle, i.e. clearly less than 90 degrees. The substrate can be placed at the opening direction of the cylindrical target and additionally, the substrate may be heated. According to FIG. 38, the target has a different, cut conical form. The result is an oblique segmented piece of a target material. Still, the laser beams are directed to contact with the target so that the last direction controlling element for the laser pulses (the mirror "8") locates outside the ablation chamber. The arrival angle of the beams with the target is also clearly less than 90 degrees.

Reference Rode, U.S. Pat. No. 6,312,768, in turn discloses ultrafast pulsed laser deposition for creating amorphous and crystalline film structures. Rode has a laser source, whose laser pulses are directed via several mirrors and through a lens before the pulses arrive on the target surface in the chamber. Rode's chamber has the possibility to include reactive or non-reactive buffer gas. Rode uses a picosecond-femtosecond range in the pulse lengths, and the pulse repetition rates vary typically from around 10 kHz up to 100 s of MHz. Rode's purpose is to vary the speeds of the released components from the target so that the components reaching the substrate will form a substantially continuous flow of atomic particles, despite the pulsed type of material release because of the laser pulses reaching the target. The laser pulse contact with the target can be directed by steering the laser beams on the fixed target, or by moving the target across the fixed direction of the incoming laser beams.

Regarding laser beam direction control in a bar code scanning device, U.S. Pat. No. 4,699,447 (Howard) discloses a "basket-shaped" structure incorporating a series of reflective surfaces. While the application area is different compared to laser ablation processes, it is notable that there is an obliquely locating first mirror and the basket inner wall acting as a second reflecting surface for the laser beam. Actually the second reflecting surface is formed from six mutually fixed oblique surface parts (see FIG. 1). The first mirror may rotate relative to the basket-like surface or other way around with a motor means so that a desired laser beam flow pattern is created outwards from the device for reading a bar code.

A second kind of a bar code scanner is shown in U.S. Pat. No. 4,870,274 (Hebert). This device has principally a similar type of the device structure like Howard. In Hebert, the rotating component is in a transparent middle element of the scanner which comprises an oblique mirror surface. With a second reflection from the fixed array of peripheral mirror surfaces, the beams can be directed outwards from the scanner. The device also collects the backscatter from the "lit" surface, where the bar code locates, and in the detection part of the device, the flow of the light beams in general travel the above elements in an opposite direction until the reflected backscatter reach the detection and imaging elements through an imaging lens.

U.S. Pat. No. 8,828,506 (Ruuttu et al.) discloses a turbine scanner which has a plurality of reflecting mirrors rotating around an axis locating perpendicular in relation to the mirror surface normals. The cross-section of the turbine scanner thus forms a polygon, with e.g. eight mirror surfaces as shown in the examples, but also a higher number such as tens or hundreds of mirror faces is possible. The presented turbine scanner tolerates a high level of laser radiation. The number of mirror faces, the respective angles between the faces and the rotation speed of the turbine scanner is set so that the reflected subsequent laser pulse spots reaching the target will partly overlap on the target. The drawbacks of the Ruuttu's arrangement are the complicated and expensive optics, and furthermore, the duty cycle of 80%, meaning 80% utilization of the available laser energy or power.

From the above prior art it is clear that the current solutions do not provide a simple, yet effective way of target processing in laser ablation methods where the created plume of plasma and thus the flow of released material is continuous, homogenous and stable. Also the duty cycle in current methods is not optimal because the scanning line does not carve the target material in a fully smooth and even manner.

SUMMARY OF THE INVENTION

The invention relates to laser processing of materials through laser ablation and more specifically to a pulsed laser deposition (PLD) process, where the interaction of a laser beam (preferably short laser pulses) with a target material, acting as a material source, leads to release of the material and under suitable conditions the released material can be collected and fixed onto a surface of an object or a component, also called as a substrate. Requirements for an industrial coating process include, but are not restricted to, high throughput, reliability, ability to produce coatings homogeneously on large surface areas, robustness, scalability to even higher throughputs and scalability to produce even larger surface areas. A method and an arrangement for pulsed laser deposition process, including an annular target, a rotating mirror and means for holding and manipulating a substrate, addresses the aforementioned requirements and also requirements of ultra-fast pulsed laser deposition process employing ultra-short laser pulses (with pulse lengths less than 100 ps) applied at high repetition rates (>100 kHz).

The object of this invention is to provide an arrangement for pulsed laser deposition process enabling the utilization of pulsed laser deposition in large scale industrial coating processes through straightforward scalability of the target arrangement. This means using another shape of the target material combined with an arrangement suitable for continuous scanning of the target without any discontinuations in the ablation process.

Laser beam interaction with the target is a function of laser properties and target material properties. The laser properties comprise wavelength, pulse length, pulse energy and intensity, laser spot size, spatial and temporal intensity distribution, polarization and the angle of incidence of the beams on the material. On the other hand, the target material properties comprise surface topography, quality (density, particle size, homogeneity), specific heat, heat conduction, heat of vaporization, temperature, crystal structure and orientation, and thermodynamic state of the material.

Furthermore, it must be noted that the process is characteristically dynamic and the interaction conditions and material properties are not necessarily constant even during a single ultra-short laser pulse. The formation of the plasma takes place in picosecond time scales, which means that pulses longer than that, the high repetition rate processing and bursts of laser pulses (with short time intervals) can involve also interaction of the laser pulse with the plasma formed in the ablation process. As another issue, the plasma expansion is a function of nature of the laser/matter and laser/plasma interactions, and further, a function of the pressure in the environment, meaning the interaction with gas molecules. Plasma has a spatial distribution, and it can be characterized by a degree of ionization, size, velocity, and energy of the emitted species.

The laser pulses can be applied as a continuous train of equally temporally separated laser pulses or bursts of laser pulses containing two or more pulses which are applied at a higher repetition rate compared to the overall repetition rate. Furthermore, the continuous train laser pulses or bursts of laser pulses can be controlled to skip certain pulses or bursts in order to ablate certain regions or segments of a target. This provides control over the distribution of material deposited on the substrate.

In some cases, it is preferential to get an adequate spatial separation between successive laser pulses such that the interaction of the laser pulses are with solid material and no laser energy would be absorbed by the plasma generated in the laser ablation process. In the case of high pulse repetition rate, this means that the scanning of the laser pulses needs to be performed at high speed. On the other hand, the production rate and the rate of material removal are functions of the repetition rate. Enabling high scan speeds thus enables higher production rates (i.e. increases the limit of maximum deposition rate). Taking into account these facts, realizing an industrial coating process based on the pulsed laser deposition requires a reliable and stable method to produce high scanning speed of the pulsed laser beam.

As mentioned by reference Rode, macroscopic particles and droplets and particles common to nanosecond range pulsed laser deposition can be avoided by using pico- and femtosecond lengths for the laser pulses and much lower laser pulse energies that in ns-range PLD in combination with higher pulse repetition rates (typically from kHz:s to MHz:s instead of tens of Hz).

High repetition rate of the laser pulses can be utilized, by selecting an appropriate repetition rate and target-to-substrate distance, in production of a continuous flow of atoms on the substrate surface leading to growth of structured thin films, for example using epitaxial growth.

Laser pulses are scanned across the surface of the target during the evaporation process in order to keep the laser-target interaction in the regime of transparent vapors. This can be achieved by steering the laser beam or by moving of the target. Also by prohibiting laser pulses hitting upon the same spot on the target surface, disadvantageous crater formation can be avoided on the target surface.

The laser beams can be directed via an arrangement called a turbine scanner. The turbine scanner is formed by mirror surfaces which together form a polygon. The number of surfaces may be from three up to tens or even hundreds of surfaces. The rotation axis of the turbine scanner may locate 90 degrees from the surface normal vectors of the mirror surfaces. The mirrors may also locate in an oblique location in relation to the rotation axis. The polygon-shaped mirror structure may be rotated in a large angular velocity, and the size of the turbine scanner may be selected freely concerning the used application. The basic principle is to control the velocity of the turbine scanner mutually with the pulsed laser source so that the reflected laser pulses will form a scan line or a desired scan line pattern on the target surface. The turbine scanner also enables larger scanning widths than what has been possible in prior art solutions, and consequently the coating of larger surface areas with one and the same laser apparatus is possible. Thus, a good working speed is achieved with using the turbine scanner, and the created surface can be made homogeneous as well.

As a key feature of the invention, the target is formed in an annular, i.e. circular shape. The last reflecting element (mirror) affecting the laser beam is located in the center spot of the annular target, in the preferred embodiment of the invention. The scanning line travelling across the target will also thus be essentially circular. By increasing the diameter of the annular target, it will have the following benefits. Higher scanning speed on the target surface is possible with the same rotational speed of the mirror. A larger radius of curvature means less curvature related effects under the irradiating laser spot and in the jet of ablated material. A further advantage is that with an increased distance from the scanning optics means smaller density of harmful material build-up on the optics. A larger surface area for the ablation process means also slower overall wear with the same material removal rate. Finally, material could also be deposited on a larger area as a result from a larger radius of curvature of the annular target.

The pulsed laser deposition arrangement with an annular target can be realized as a stand-alone unit mounted for example on a single vacuum-system flange where such a specially formed target can be fitted to an existing coating arrangement as a source for material to be deposited on the selected kind of substrate. This type of arrangement also allows for a quick exchange of these material source units and for multiple material source units to be placed in one coating system chamber for increased material throughput. In order to ensure an uninterrupted process, the annular targets can be arranged in series or in parallel. The series connection of the annular targets means that when a first annular target has worn off totally, the second annular target having a slightly larger radius will make contact with the arriving laser pulses, and the process may continue as long as is required. The parallel connection of annular targets means that there are several annular targets having the same radius of curvature, and the targets may locate on top of one another, forming together a cylindrically formed target area. In this kind of arrangement of several targets, the scanner mirror or the targets need to move vertically when the first target is worn and the second target is taken under ablation. A second option is to direct the laser beam in a slightly oblique angle when the target under the ablation process is switched from the first target to the second target.

The circular scanning arrangement has the following advantages when compared to conventional scanning techniques previously applied in pulsed laser deposition methods. The process is continuous, where there are no turning points related to acceleration and deceleration cycles typical in galvanometric scanning comprising turning mirrors. Furthermore, constant scanning speed is obtained throughout the process. Further, no laser energy is lost due to mirror edges of the polygon scanners. This means a complete, 100% utilization of the available laser power compared to that of a polygon scanner which does not have 100% efficiency. As yet another advantage, focusing with simple optics instead of more complex scanning lenses and f-theta telecentric lenses, there are no compromises related to the scanning lenses, scan field flatness, telecentricity errors or bowing (present in polygon scanners). As a result of simpler optics, the costs are lower. Finally, no scalability limitations related to optics will be present because the scanning lenses would incorporate manufacturing limitations. However, the target manufacturing will be somewhat more difficult as diameter of the target increases.

DETAILED DESCRIPTION OF THE INVENTION

The present invention introduces a laser ablation and deposition arrangement and method comprising a scanning arrangement and method for a thin film forming apparatus comprising a rotating mirror and a circularly shaped target, resulting in a lighthouse-type of a scanning device. The circularly shaped target may be a ring-formed or a cylindrically formed target, i.e. its cross-section on the plane of the scanning beam (output beam) is substantially a circle. The arrangement is formed thus with physical components where a laser source is the energy source, the elements are controlling and interacting with the laser energy, and the released material from the target as a result of the laser beam contact will in the end form e.g. a coating on a substrate. At least the laser beam contact with the target and the material flow into the substrate will preferably be located inside a vacuum chamber, providing a controllable environment for the laser ablation. The device and the corresponding method allow coating a substrate (element, component, small or large surface or another thin film) with one or more coating materials originating from the target.

Figure 1:
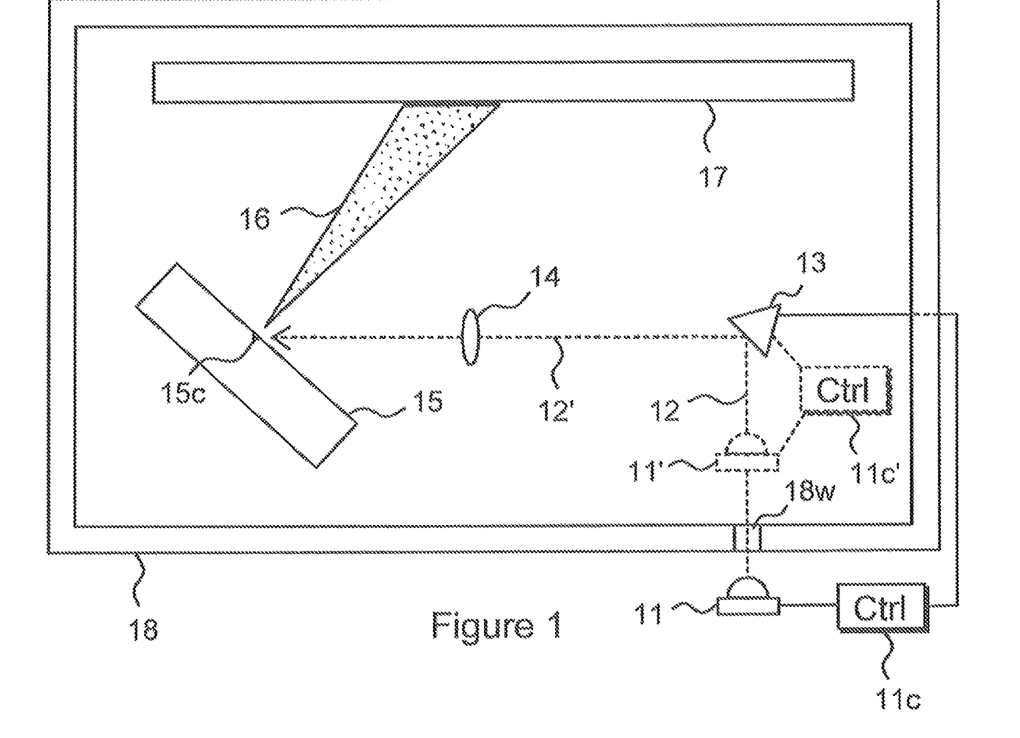
FIG. 1 illustrates the coating process applying the pulsed laser deposition (PLD) in general.

At first, we refer to FIG. 1 discussing generally the pulsed laser deposition for creating e.g. a good-quality coating on a desired surface. In this Figure, the target is simplified as a simple rectangular element for illustrative purposes only, and in the actual invention, the target is discussed in a more detailed manner.

The basic arrangement for realizing the method of the invention consists of a laser source 11, 11', an optical path 12, 12' to guide the laser beam (laser pulses), at least one focusing lens 14, and the ablation will take place in a vacuum chamber 18. Within the vacuum chamber 18 there is a laser beam manipulating element such as a rotating scanning mirror 13, an annular target 15 (simplified in the Figure as a rectangular target block for illustrative purposes) with mechanics capable of holding and manipulating (like e.g. moving and/or rotating) the target 15, and a substrate 17 together with the holding means and mechanics enabling the manipulation (like e.g. moving and/or rotating) of the substrate 17. Additional features in the ablation arrangement are control means 11c, 11c' for the laser pulse control (pulse picking), optical elements for changing the properties of the laser pulses (e.g. polarization, intensity distribution, beam splitting into multiple beamlets), means to protect the rotating scanning mirror 13 from material build-up (static masks and diaphragms, dynamic masks and diaphragms (e.g. rotating with the scanning mirror), electric and/or magnetic fields, heating elements, gas flow arrangements), static and dynamic masks between the target and the substrate to selectively manipulate the flow of the ablated material both spatially and temporally. In one embodiment, the control means 11c, 11c' may control the laser source 11, 11' but also the optical elements such as possible movement or focusing of the lenses, and additionally the control means (or a controller) 11c, 11c' may control the rotation of the rotating mirror 13 for directing the laser pulses towards the target contact point 15c on the annular target 15. In order words, according to an embodiment of the invention, the arrangement comprises control means controlling the laser source 11, 11', the optical means (lenses and a possible turbine scanner) and the rotation of the mirror 13 in a desired manner. The latter includes selecting the direction and angular velocity and a possible scanning line pattern with the rotatable mirror 13.

In the context of the description and the claims, the at least one focusing lens 14 and a possible turbine scanner 21, 22 (see the description of FIG. 2) along with the mentioned optical elements from above, together are part the optical means specified in the claims. The optical means comprise one or more such manipulating elements for the laser beams. The focusing lens 14 or several lenses may be arranged so that the lens or lenses may be moved in the direction of the laser beam 12, 12', i.e. along the propagating laser beam. In one embodiment, the focusing lens 14 is moved along the laser beam 12, 12' in synchronization with a linear movement of the target 15.

The rotating mirror 13 may be a simple rectangular two-dimensional piece of plane provided with a reflecting surface facing the incoming laser pulses, and where the rectangular piece of mirror is rotatable around an obliquely locating rotation axis.

Otherwise, the rotating mirror 13 can be a cross-sectionally triangular element with mirrored outer surfaces, where the element may for instance have a pyramid form, turned around as upside down. The rotation axis of the rotating mirror 13 is substantially parallel with the direction of the input laser beam in the preferred embodiment.

The focusing lens 14 or lenses may locate anywhere along the laser pulse path 12, 12'. The lens 14 may therefore locate also between the laser source 11 (or 11') and the mirror arrangement 13. The turbine scanner option is discussed in FIG. 2 in more detail.

In an embodiment, the optical means (or optical elements as said above) 14, 21, 22 further comprise means configured to manipulate the spatial intensity distribution of the input laser beam 12.

The laser source 11 can be a pulsed or continuous wave laser, and able to operate with laser properties and parameters suitable to the process. In a preferred embodiment of the invention, the laser source 11 produces laser pulses. In a further embodiment, the laser source 11 is able to produce pulse bursts comprising two or more laser pulses.

In one embodiment, the laser source 11 and its controller 11c is located outside the vacuum chamber 18. The laser pulses are fed inside the vacuum chamber 18 through a window 18w locating in the wall of the vacuum chamber 18. In another possible embodiment of the invention, also the laser source 11' and the controller 11c' are placed inside the ablation chamber 18. In this option, the laser source 11' creating the laser pulses, the manipulating elements of the pulses, the ablation of the material 16 in the target contact point 15c of the target 15, and the substrate 17 to be coated with the released material are all placed and the method steps will therefore be implemented inside the vacuum chamber 18. The target contact point 15c will move on the inner surface of the target 15 in a desired pattern, in order to avoid steep holes to be formed on the target surface during material release process.

The arrangement comprises a capability to control at least the pressure and the temperature and possible additional materials (flowing in and/or flowing out) present within the vacuum chamber 18. In other words, the chamber 18 is provided with a controlled flow of background gas in a controlled pressure during the laser ablation and deposition. Background gas may be inert or reactive. The additional material(s) may be in gaseous form but also liquid submersion is possible for the ablation process in some useful embodiments.

Figure 2:
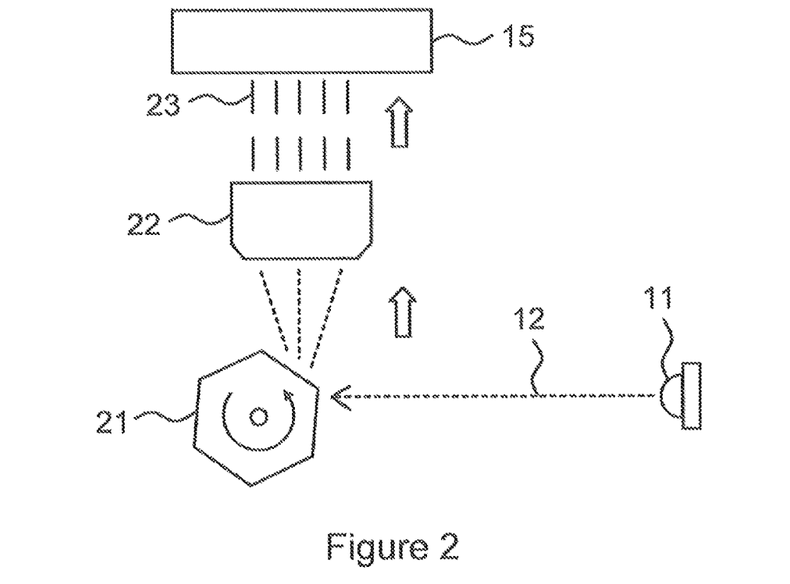
FIG. 2 illustrates an example of a turbine scanner which may be used in generating desired kinds of laser pulses or laser pulse fronts.

FIG. 2 shows an example of a turbine scanner which can be used as an optical tool (part of the optical means) between the laser source 11, 11' and the rotating mirror 13 (the latter is not shown in FIG. 2). The turbine scanner manipulates the incoming laser pulses into a laser pulse front which propagates on a single plane. The structure of the turbine scanner includes turning mirror surfaces 21 which can be formed as a polygon and which is rotatable around its axis. The angles between the mirror surfaces can be selected so that the resulting reflected laser pulses form a fan-shaped set of laser beams. The reflected pulses are directed to a telecentric lens 22, which in turn manipulates the incoming reflected pulses into a substantial parallel set of laser beams 23. The manipulated laser pulse front 23 may still be directed into a further lens or several lenses (not shown in FIG. 2), such as to lens 14 shown in FIG. 1, or some other lens locating before the mirror 13. Finally, the manipulated laser pulse front makes contact with the rotatable mirror 13. The operation of the turbine scanner 21, 22 may be controlled by the same controller 11c, 11c', which has already been discussed above.

Figure 3:
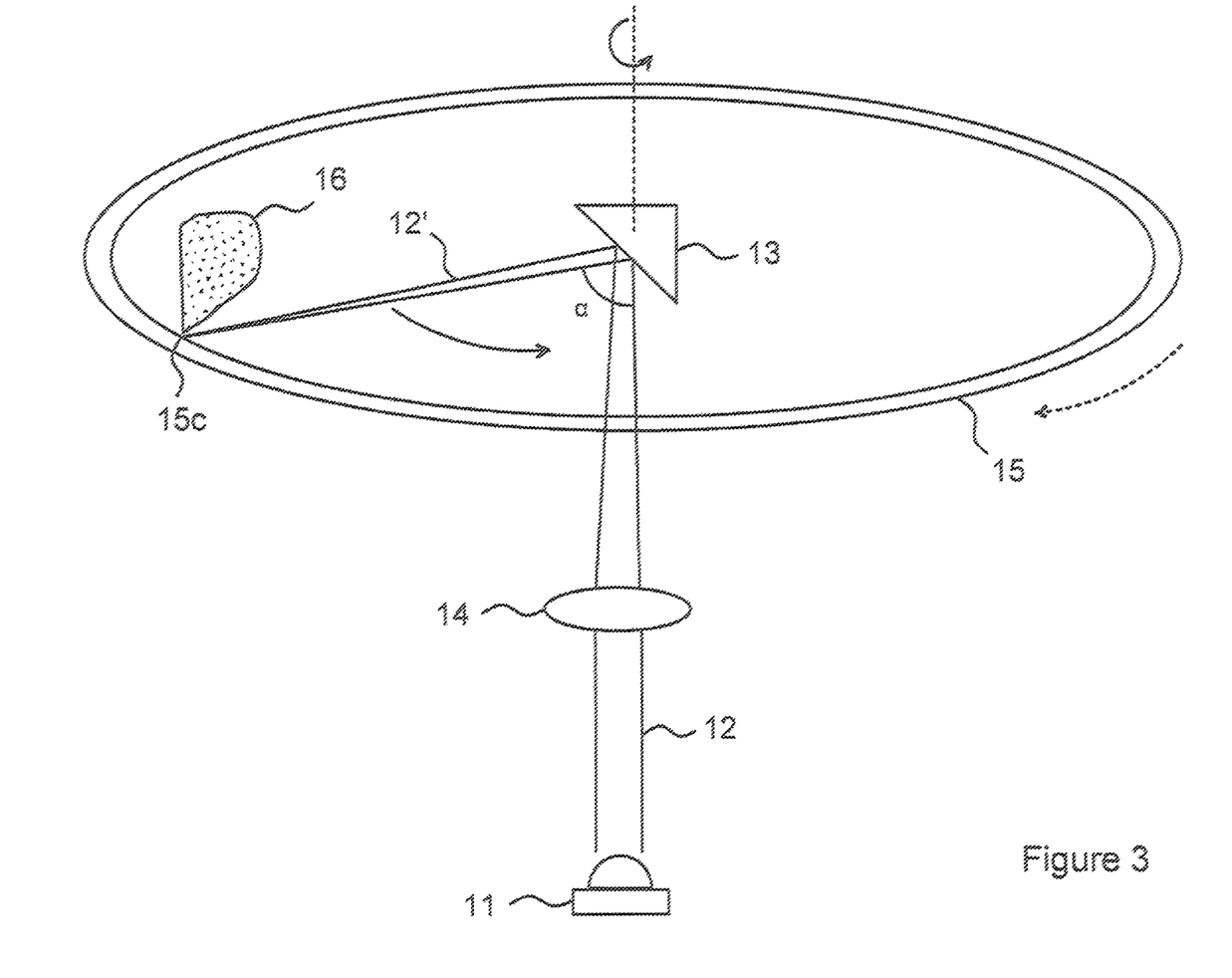
FIG. 3 illustrates an embodiment of the annular form of the target according to the invention, which target is usable in pulsed laser deposition processes.

FIG. 3 shows the target 15 in more detail according to the preferred embodiment of the invention. The target is shaped in an annular form, and preferably it forms a complete circle when looked from the above as shown in FIG. 3. Actually the target 15 may form a shape of a ring, meaning a thin segment of a cylindrical wall structure. The center point of the target 15 is positioned along the axis of rotation of the rotatable mirror 13. Thus, the center point of the annular target 15 may be the same as the reflection point of the rotatable mirror 13, but the center point may also locate directly above or beneath the mirror 13, if the annular target plane is located horizontally, as shown in FIG. 3. Therefore, the reflection angle $\alpha$ of the laser beam in the mirror 13 may be substantially equal to 90 degrees, but in other embodiments, the reflection angle $\alpha$ may be freely selected from angle values fulfilling $0<\alpha<180°$. When the rotating mirror 13 (meaning its effective reflection point for the laser beams) is placed in the midpoint of the annular ring-shaped target, the distance from the reflection point to the target surface will remain constant all the time (when no wear of the target is taken into account). When the ablation process is turned on, the reflective element 13 is controlled in its first embodiment so that the reflective element is rotated in a constant angular velocity.

The result is that the laser beams 12' will affect the inner surface of the annular target in a smooth and uniform manner. In other words, the rotating mirror functions similarly as a lighthouse, and the result is a substantially circular scanning pattern on an inner surface of the annular target.

Figure 4:
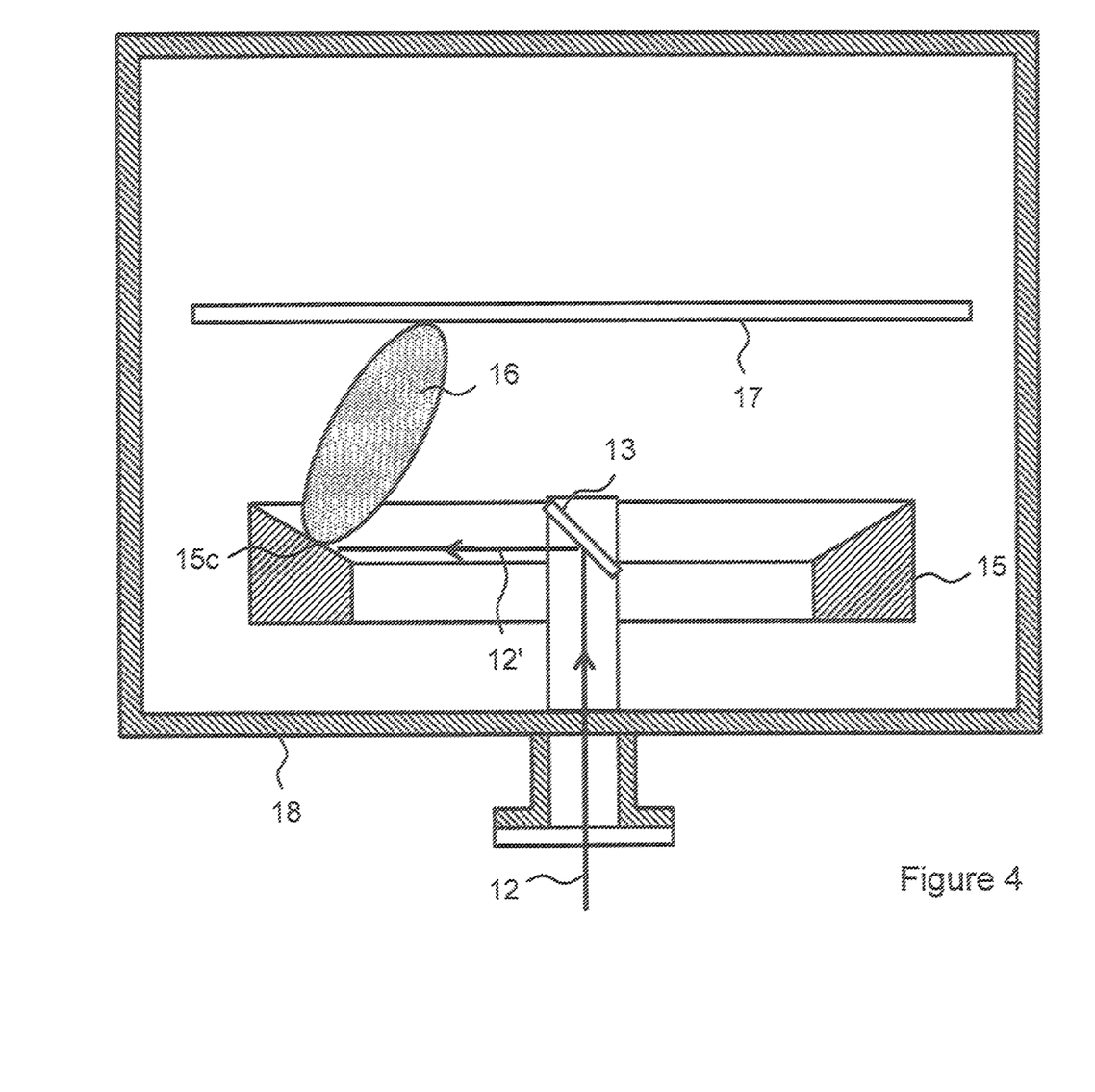
FIG. 4 illustrates a cross-sectional, direct side view of the scanning arrangement according to an embodiment of the invention.

FIG. 4 shows another kind of viewpoint of the same arrangement already shown in FIG. 3. FIG. 4 is a cross-sectional direct side view "cut" with a vertical plane locating in the middle of the arrangement. The input laser beam 12 arrives to the arrangement beneath the vacuum chamber 18. The beam 12 will travel into a hollow tube 51 or pipe where it will pass a window 18w, thus arriving into the chamber 18. The rotating mirror 13 is placed obliquely in the propagation path of the beam 12, and the rotation axis of the mirror 13 is in this picture vertically directed. The beam will reflect to a horizontal direction as beam 12'. While the mirror 13 rotates around a total circle, the respective reflected beams 12' will together form a horizontal scanning plane. The point of contact of the reflected beam 12' and the tapered inner surface of the annular target 15 is the spot 15c. The result of the ablation is a material plume 16, which as a result of the oblique arrival angle onto the target will point out in a tilted direction upwards. In this direction locates also the substrate 17 which is ready to receive the released particles. When the material plume 16 makes contact with the substrate 17, it will stick onto it and form a coating on it. The result is e.g. a thin film formed from the target material onto the substrate sheet or component where the coating can be produced in an industrially professional manner and speed.

Figure 5:
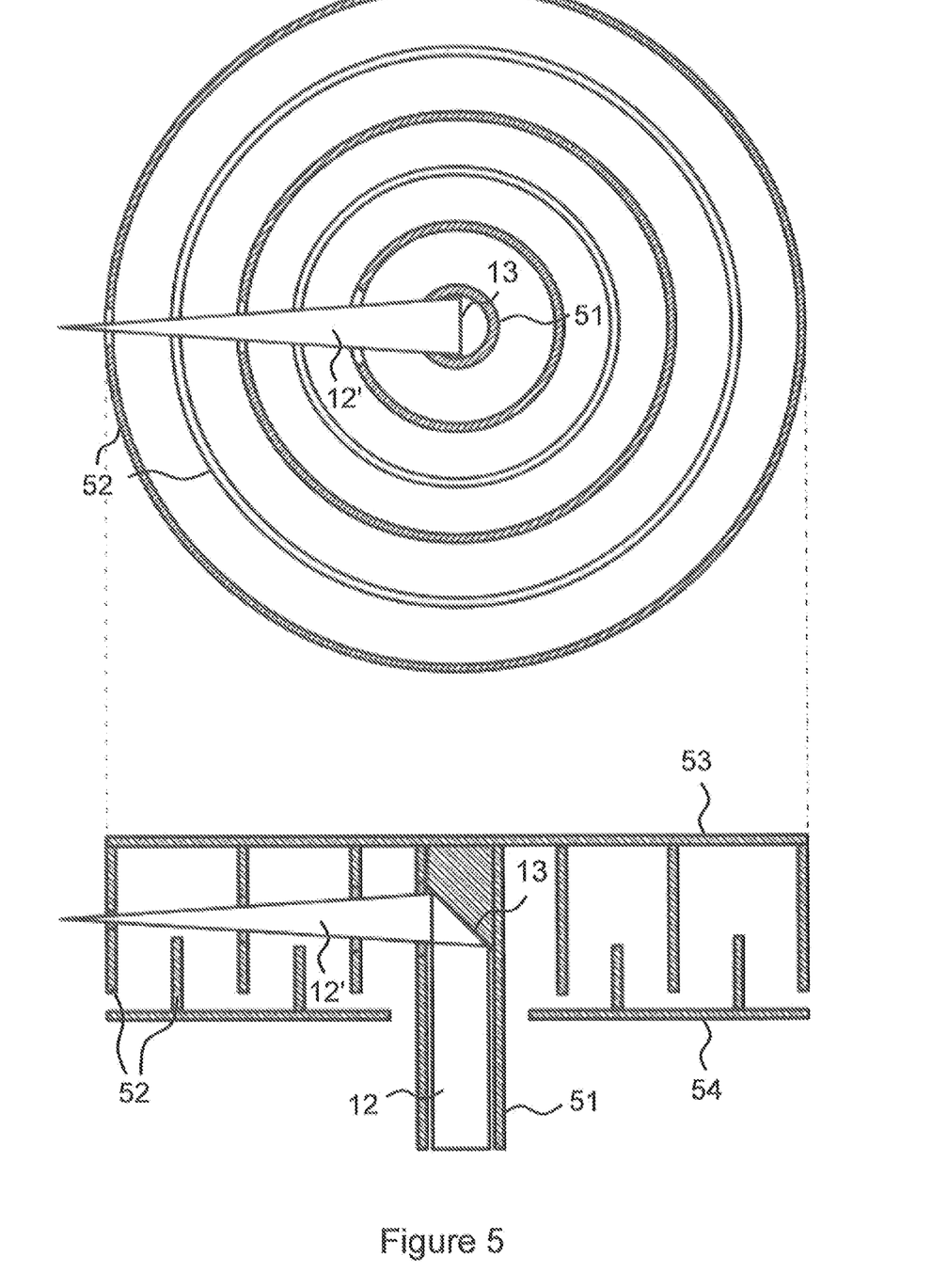
FIG. 5 illustrates an example of a protective enclosure around the rotating mirror.

FIG. 5 illustrates an example of a protective enclosure used for protecting the rotating scanning mirror 13. The upper part of FIG. 5 shows the arrangement from the above as a cross-section, and the lower part is shown as a side-view, and also as a cross-section. Such an arrangement is used to prevent target material build-up on the mirror 13. The input laser beam 12 may travel through a hollow tube 51 towards the mirror 13, wherein the input laser beam 12 direction is parallel to the axis of the hollow tube 51. The reflected beam 12' will propagate from the mirror 13 towards the target through gaps in the protective shield structure 52. In this example, five protective wall pieces 52 are placed in a protective enclosure. Naturally, there might be some other number of protective walls, depending on the required effectiveness needed in the protection of the mirror 13. The contact point with the target will naturally locate outside the farthermost protective wall piece. The protective walls 52 are preferably formed in a circular shape, locating centrically inside the annular target. The wall pieces 52 may be fixed to the enclosure base in an opposite manner, such as shown in the figure where the first, middle and the last pieces are fixed to the top base plate 53 and the second and fourth pieces are fixed to the bottom base plate 54. The pieces fixed to the top base plate 53 have holes where the reflected laser beams 12' can propagate through. When the mirror 13 and the hollow tube 51 rotates according to the principle of the invention, the top base plate 53 together with the first, third and fifth wall pieces rotates too. The bottom base plate 54 together with the second and fourth wall pieces will remain stationary in relation to the upper enclosure part. Furthermore, it is possible to feed gas to a selected gap between the protective walls, and correspondingly, to pump out the gas e.g. from some other gap between the protective walls. Such an exemplary rotating shield structure collects effectively the released material pointing directly or almost directly back towards the rotating mirror 13.

The effect of the scanning on the target 15 may be enhanced by rotating the annular target 15 around its central axis in the opposite direction compared to the rotation of the mirror 13. This is illustrated by the arrows in FIG. 3 and such a target rotation will increase the effective scanning spot speed on the target 15. In one embodiment, the rotation speed of the annular target 15 is selected from values between 0.01 . . . 100 000 rpm.

In an embodiment, the rotating mirror 13 has multiple facets. In a yet further embodiment, into the rotating multi-faceted mirror 13 is coupled a rotating diffractive optical element producing a rotating bundle of laser beams (beam-lets) from a single input laser beam 12, with the axis of rotation along the input laser beam 12.

In yet another embodiment of the rotatable mirror 13, the mirror 13 is formed in a shape of a pyramid. When such a pyramid-type of mirror is placed upside down, and it is pointed with e.g. a circularly placed bundle of input laser beams 12, the reflecting beams 12' will form a horizontal beam plane when the pyramid is rotated around a vertical axis. By selecting the amount of laser beams in the bundle, a possible rotation of the created bundle, together with the rotation speed of the pyramid, the resulting scanning pattern is more complex on the inner surface of the annular target 15. The material plume can be created simultaneously in e.g. 4 different locations 15c around the target if the mirror 13 is a square pyramid, if at least one laser beam of the bundle makes contact with each of the pyramid side triangles, irrespective of the mirror rotation angle. Such an embodiment makes the process even more rapid and suitable for coating a larger sheet area in a shorter time.

In creating the parallel bundle of laser pulses or beams, the earlier discussed diffractive optical element may be used. Another option is to include a turbine scanner between the laser source 11 and the rotating mirror 13. A yet another option is to have several laser sources, or other kinds of optical means which divide the single laser beam into a bundle of beams or beamlets.

With the substantially circular scanning pattern, we mean the form created together by all the contact spots 15c around the annular target 15 after the mirror arrangement has already rotated for a while at least. If the mirror is a simple 2-dimensional mirror plane rotating in an oblique angle, the reflecting beams 12' will form a continuous circle. In case we use a pyramid type of mirror 13, together with a bundle of laser pulses incorporating parallel (e.g. a circle-shaped or square-shaped) laser beams where the center of the bundle will point at the pyramid top point now pointing directly downwards, the resulting contact points 15c will simultaneously ablate the material in four segments of the inner surface of the target 15, but the end result will be a 360 degrees coverage of contact points 15c which together form a circular scanning pattern on the cross-section of the horizontal scanning plane with the inner target surface.

Naturally, the directions of the whole arrangement can be tilted to any other appropriate angle depending on the used application. For instance, the arrangement of FIG. 4 could be turned 90 degrees clockwise, when the ring-shaped target would locate vertically and also the substrate would locate in a vertical direction. In that case the material plume would flow obliquely to the right-hand side and the incoming laser beams would be created by the laser source locating in the left-hand side of the arrangement (in case no additional mirror arrangements are used for beam redirecting).

Plasma or other material 16 is disengaged from the target when the laser pulses make contact with the target inner surface 15 along the circular scanning pattern, and the removed material will form a material cloud 16 or material plume. The plume may include plasma, particles or other kinds of target material pieces in different sizes. When the laser beams 12' make contact along the inner circumference of the target as pointed e.g. by the arrow in FIG. 3, the created plasma cloud 16 emerges from different places along the perimeter of the circular target. When the plasma releases to an upwards direction as is shown in FIG. 3, the material flow reaching the substrate 17, will in preferred embodiment coat a much larger area of the substrate without moving the substrate at all. If the substrate 17 is moved in a desired pattern together with the depicted kind of target 15, the result is a highly industrial and scalable coating method of the substrate which coats the surfaces and elements in much higher speed than previously.

In one embodiment, the ablated released material 16 may be influenced by an electric field or by a magnetic field or by both. In another embodiment, the deposition process can be influenced by ion bombardment from an ion source. In one embodiment relating to the substrate to be coated in the deposition process, the substrate 17 can be electrically biased.

The inner surface of the annular target 15 may have a tapered shape in order to control the direction of the releasing material plume. The whole inner surface edge of the target thus may have an oblique angle. It is also possible that the inner edge of the target 15 has a zigzag-type of roughened shape, creating a non-smooth surface for the inner edge of the target 15. When the ablation process has taken place for a while, it is notable that the target wear will affect the contact surface smoothness. The present invention however enables a uniform wear pattern on the target because the scanning will happen in a similar way as the lighthouse works.

Generally regarding the ablation method and the tuning of the optical elements, the spot size of the reflected laser beam 12' on the inner surface of the annular target 15 may be substantially the same for all rotation angles of the rotatable mirror 13, where the focal point of the reflected laser beam 12' may locate substantially on the inner surface of the annular target 15, and where coating material 16 is released from the target 15 along the circular scanning pattern as a material plume. As a result, the released material plume 16 is directed onto the substrate 17 to obtain a coated substrate. However, this is not always the desired situation, and the spot size on the target and the focal point may also vary during the scanning process.

More specifically, the focusing lens 14 has a focal length defined by the diameter of the annular target 15 and the distance between the lens 14 and the target surface 15c. Furthermore, the focal length and positioning of the lens 14 are defined by additional beam manipulation optics, e.g. a beam shaper to change the intensity distribution of the laser spot on the target 15c, and the desired intensity distribution and spot size on the target surface 15c.

As also mentioned above, the focusing lens 14 or one lens among several applied lenses may well locate on the same plane as the annular target 15, i.e. between the rotating mirror 13 and the target contact point 15c. In such a case, lens 14, target 15 and mirror 13 all locate essentially on the same plane and the reflection angle $\alpha=90°$.

In a preferred embodiment of the invention, the focusing lens 14 can be moved along the direction of the laser beams 12, 12' to change the location of the beam waist with respect to the target surface. This feature allows maintaining the spot size accurately on the target surface 15c during the process as the target 15 wears in the ablation process along material removal 16 from the target.

In an embodiment, the optical means 14, 21, 22 comprise a rotating optical element configured to change polarization of the input laser beam 12, where the rotating optical element is synchronized to the rotation of the mirror 13.

In case the incoming laser beam 12 is static with linear polarization and the circular scanning pattern is produced by a rotating oblique mirror 13, the polarization of the scanned laser beam changes continuously throughout the rotation. The polarization affects the reflection properties of the laser on the target surface. Without corrective optics this would lead into different ablation conditions at different rotation angles of the circular scan. In a preferred embodiment of the invention, the polarization of the incoming laser beam 12 is controlled such that the laser beam hitting the surface of the target 15c is P-polarized which yields minimum reflectance, especially at the Brewster's angle. The polarization control can be realized by rotating a half-wave plate synchronized with the scanning mirror 13 rotation and having half of the speed of the scanning mirror 13 rotation speed. The polarization of the target hitting laser beam can also be S-polarized, circularly or elliptically polarized in other embodiments of the invention. An important factor is to maintain the laser-target interaction constant throughout the scanning cycle.

In an embodiment of the invention, the laser beam 12, 12' is guided through a hollow motor spindle which produces the rotating motion of the scanning mirror 13 (similarly as described in "Howard"). In other words, the rotating motion is coupled to the mirror 13 with a hollow tube 51 through which the input laser beam 12 can be guided to the mirror 13. This structure enables a compact arrangement of the components inside the vacuum chamber 18 such that the space on the other side of the scanning plane is free for the substrate 17 movement.

Generally regarding the holding and manipulating features of the target and the substrate, the substrate to be coated may be held at a selected distance and angle from the annular target. Furthermore, the substrate preferably is located on an opposite side of the target compared to the incoming laser beam. In a further embodiment, the ablation and deposition method comprises moving or rotating the substrate in the material plume released from the surface of the annular target.

In one embodiment, the substrate may be in a form of a relatively thin, planar sheet-like of surface which may be bent and rolled as a roll without damaging the sheet. The uncoated substrate sheet may be stored around a first roll, from where it is released to the deposition area, where the substrate 17 has contact with the arriving released coating material 16. When the coating has attached on the surface of the substrate during the deposition, the coated planar substrate may be post-processed (e.g. cooled down if the processing area has been heated externally), and finally the post-processed coated substrate may be collected and rolled around a second roll for storage of the resulting product.

In one embodiment regarding the volume where the material plume 16 travels towards the substrate 17 to be coated, a physical mask can be placed between the target 15 and the substrate 17. This can be performed to create desired coating patterns on the substrate. This enables even complicated patterns and fine-tuned distributions of the coated material on the substrate. In a further embodiment of the physical mask, the physical mask is configured to move during the process. In a yet further embodiment, the physical mask is configured to rotate synchronically with the rotation of the mirror 13.

In an embodiment of the invented arrangement, the rotating obliquely angled mirror surface locates at a 45° angle compared to the input laser beam 12 direction such that the scanning plane is perpendicular to the optical axis of the input laser beam 12. In other embodiments, however, it is possible to place the mirror plane at less than 45° angle (sharp angle) to the input beam direction or at larger than 45° angle (obtuse angle) to the input beam direction. In yet another embodiment, the angle of the rotatable mirror 13 may be changed with respect to the input laser beam 12 during the scan.

The required rotation speed of the scanning mirror 13 is defined by the diameter of the annular target 15 (circumference of the ablated surface on the target which can be a dynamic value), the laser spot size along the scanning direction, pulse repetition rate of the laser beam 12, 12' incident on the target, desired overlap or separation between successive laser pulses, and desired energy distribution along the scan. Rotation speeds can have values in a wide range from a fraction of rps to tens of thousands of rpm (0.01 rps-100 000 rpm). The energy of the laser pulses 12, 12' can be controlled in synchronization with the rotation of the mirror 13.

In one embodiment regarding the scanning speeds of the laser spots travelling on the target surface, the diameter of the annular target 15 and the rotation speed of the mirror 13 are selected such that the speed of the scanned laser spot on the target 15 is at least 1 m/s. In another embodiment, the corresponding values are selected so that the above scanning speed will be at least 10 m/s. In yet another embodiment, the corresponding values are selected so that the above scanning speed will be at least 100 m/s.

In addition to scanning the laser beam 12' on the target surface 15 on the circular path, the relative speed between the target 15 and the scanned beam can be increased by rotating the annular target 15 to the opposite direction compared to the scanning beam.

As the laser pulses strike the surface of the target material 15, a jet of ablated material 16 will be released practically in all directions from the point of incidence 15c. Although the jet 16 has some directionality and angular distribution, some portion of the material will travel to the direction of the laser beam, towards the scanning mirror 13 (this portion is not shown in FIGS. 1-3). In order to avoid, or at least minimize, the amount of material build-up on the mirror 13 and/or to maintain the laser pulse energy throughout the process, in an embodiment of the invention, the mirror 13 is protected using one or a combination of the following features:
- static mechanical shields between the target and the mirror allowing the laser beam to pass unobstructed but limiting the amount of ablated material travelling in the opposite direction in comparison to the laser beam propagation;
- an enclosure around the scanning mirror having a higher pressure compared to the rest of the space in the vacuum chamber making the free path shorter for the material ejecting from the target (i.e. pressure control around the mirror);
- an enclosure around the scanning mirror with a gas flow obstructing the free movement of the material ejected from the target;
- an enclosure having a path (i.e. a tube, a shield or an aperture rotating with the mirror) for the laser beam rotating with the mirror making the time shorter when the mirror will be exposed to the incoming target material. This particular solution is especially enabled by the way the scanning is produced on an annular target, and it is not reasonably applicable in conventional scanning methods. Arranged around the rotating mirror, concentric rotating walls with a hole for the laser separated with static concentric walls short enough not to block the beam, one is able to realize compartments with different pressures and differential pumping to reduce the build-up of the released material on the mirror surface;
- a sacrificial layer or several layers on or in front of the mirror to be replaced after significant material build-up (e.g. a replaceable or moveable window between the target and the mirror);
- heating of the mirror to reduce the sticking of the material hitting the mirror surface;
- electric and/or magnetic means creating electric and/or magnetic fields to change the path of the incoming charged particles;
- cleaning the mirror with, e.g., a laser beam (i.e. laser cleaning) or with ion bombardment.

Using one or several of those options will preserve the reflectivity of the mirror 13 throughout the process.

In an embodiment of the invention, the annular target is placed with its center point in the axis of rotation of the scanning mirror such that the distance the laser beam travels from the lens to the target surface is the same for all the scanning angles guaranteeing thus a constant spot size throughout the scanning cycle.

The inner surface of the annular target is the surface where the reflected laser beam hits and from where the material is released in the laser ablation process. The material jet is mainly directed perpendicular to the target surface but it might also have other directions depending on the surface topography on the target. Thus, the plane of the target surface affects the propagation direction for the ablated material. The annular target can have a surface designed to produce a certain kind of material distribution or porousness in the coating resulting on the substrate. In an embodiment of the invention, the ablation surface of the annular target is tapered such that, in the plane of incidence, the laser beam forms an angle with the target surface (like in FIG. 1 if target section 15 is seen as part of an oblique inner surface of the annular target). Furthermore, this angle is determined such that the ablated material is directed away from the plane of scanning. The plane of scanning is a horizontal plane if the reflection angle $\alpha$ of the mirror is 90 degrees. In case the rotation angle $\alpha$ is $0<\alpha<180°$, the plane of scanning will be a conical surface.

The ablation process with a single scanning line on the same circular track on the target surface would eventually lead to a deep trench being formed on the target. In order to enable a stable process, the wear of the target needs to be controlled and homogeneous. That is why the location of the scan line on the target is moved during the process in addition to the circular scanning of the laser beam on the target. This makes the ablation track two-dimensional instead of a one-dimensional track, and as a result, a homogeneous wear of the target can be realized. The movement of the scan line on the target can be realized by:
- linear movement of the annular target; and/or
- changing the angle of the scanning mirror; and/or
- changing the angle of another reflecting optics; and/or
- providing refractive optics to change the angle of the laser beam incident on the target surface.

At the first option of the above, the annular target 15 is movable along its central axis.

The arrangement with a linear movement of the target provides stable conditions by preserving the angle of incidence of the laser beam on the target surface, and furthermore, is straightforward to realize as an independent movement as opposed to the wobbling of a mirror or other optics rotating at a high speed.

In the case of a tapered inner surface of the annular target, the movement of the target or the location of the scan line on the target affects the circumference length of the ablation track. This in turn affects the scanning speed on the target surface (spatial spot overlap and separation), the duration of one full scan cycle around the target, and the location of the optimal intensity distribution with respect to the target surface. In yet further embodiments of the invention, these effects need to be compensated by synchronized control of:
- the rotation speed of the scanner for the optimal separation between successive pulses; and/or
- the movement speed of the target for optimal overlapping between successive scan cycles on the target; and/or movement of the focusing lens or beam-manipulation optics (intensity distribution shaping optics) for maintaining the optimal and desired intensity distribution on the target surface.

For a continuous ablation and coating process, a constant feed of the source material is required. The annular target can in such a case be realized as a cylinder (by expanding the ring-shaped target of FIG. 3 vertically) in which case the range of the linear movement of the target changes as the target wears out on the tapered ablation surface. The cylindrical target may be moved slowly in a controlled manner in a vertical direction in order to affect new target surface under the arriving laser pulses. Another option is to e.g. incorporate controllable refractive optics between the reflecting mirror and the cylindrical target, in order to slightly redirect the angle of the laser beams towards a fresh target area. Such arrangements provide a way to have a sufficient amount of the source material available for a prolonged ablation and coating process. Such longer processes comprise industrial coating processes for exceptionally large surface areas.

Summarizing the possible shapes of the target with an annular cross-section along the scanning line, the annularly formed target 15 may have a ring shape, a cylinder shape or a truncated conical shape. A broader ring-formed segment with a tapered inner surface is an example of the truncated conical shape of an annularly formed target.

Regarding possible materials of the target 15, the annular target 15 can be made of metal, metal compound, glass, stone, ceramics, synthetic polymer, semisynthetic polymer, natural polymer, composite material, inorganic or organic monomeric or oligomeric material. In a further embodiment, the annular target 15 is composed of annular segments of at least two different materials. With such a target structure, a desired coating structure comprising at least two different coatings is possible.

Regarding some examples of the possible end products after the deposition according to the invention, the coated substrate may be a component of a lithium-ion battery, a component of a sensor or sensor device, or a cutting-tool component.

The presented method and arrangement can also be used in a production method of nanoparticles. Such a method may utilize the scanning and ablation arrangement as presented above, but additionally, the chamber which otherwise would be a vacuum or comprise a selected pressure of gas, would in this case be immersed in a liquid.

In the present invention, it is possible to combine features and/or characteristics of the invention from the above and from the dependent claims in order to achieve new variations of the invention applying at least two of the mentioned features or characteristics.

The scope of the invention is defined by the following claims.

The invention claimed is:

1. A scanning arrangement for a thin film forming apparatus applying laser ablation, wherein the scanning arrangement comprises:
    a laser source;
    a rotatable mirror for redirecting an input laser beam to a substantially circular scanning pattern around a rotation axis of the rotatable mirror, which axis is substantially parallel with the direction of the input laser beam;
    an annularly formed target, where the center point of the target is positioned along the axis of rotation of the rotatable mirror, and where a reflected laser beam makes contact with the surface of the annular target in order to release target material along the substantially circular scanning pattern;
    a chamber having capabilities to control at least the pressure, the temperature and possible additional materials present within the chamber, and wherein the rotatable mirror, the annular target and a substrate are located within the chamber; and
    a rotating optical element configured to control polarization of the input laser beam and the reflected laser beam hitting the surface of the annular target, where the rotating optical element is a half-wave plate and rotation of the half-wave plate is synchronized with the rotation of the rotatable mirror such that rotation speed of the half-wave plate is half of rotation speed of the rotatable mirror, and that the polarization of the laser beam hitting a target surface is constant throughout a scanning cycle.

2. The arrangement according to claim 1, wherein a rotating motion is coupled to the mirror with a hollow tube through which the input laser beam can be guided to the mirror.

3. The arrangement according to claim 1, wherein the rotating mirror has multiple facets and the rotating mirror is coupled to a rotating beam dividing type component producing a rotating bundle of multiple laser beams from a single input laser beam, with the axis of rotation substantially parallel with the direction of the input laser beam, and wherein at least one laser beam of the bundle makes contact with each of the facets of the rotating mirror.

4. The arrangement according to claim 1, wherein the arrangement further comprises beam shaper optics configured to manipulate the spatial intensity distribution of the input laser beam.

5. The arrangement according to claim 1, wherein the laser beam hitting the target surface is P-polarized, S-polarized or elliptically polarized.

6. The arrangement according to claim 1, wherein the diameter of the annular target and the rotation speed of the mirror are selected such that the speed of the scanned laser spot on the target is at least 100 m/s.

7. The arrangement according to claim 1, wherein the annular target is rotated around its central axis in the opposite direction compared to the rotation of the mirror.

8. The arrangement according to claim 1, wherein the annular target is made of metal, metal compound, glass, stone, ceramics, synthetic polymer, semisynthetic polymer, natural polymer, composite material, inorganic or organic monomeric or oligomeric material.

9. The arrangement according to claim 1, wherein the annular target is composed of annular segments of at least two different materials.

10. The arrangement according to claim 1, wherein the reflectivity of the mirror is preserved throughout the process by:
    static mechanical shields; and/or
    moving shields, tubes or apertures; and/or
    electrical means; and/or
    magnetic means; and/or
    heating of the mirror; and/or
    pressure control around the mirror; and/or
    gas flow; and/or
    laser cleaning; and/or
    ion bombardment; and/or
    sacrificial layers between the target and the mirror.

11. The arrangement according to claim 1, wherein the annularly formed target has a ring shape, a cylinder shape or a truncated conical shape.

* * * * *